(12) United States Patent
Wang et al.

(10) Patent No.: US 8,030,210 B2
(45) Date of Patent: Oct. 4, 2011

(54) CONTACT BARRIER STRUCTURE AND MANUFACTURING METHODS

(75) Inventors: Ching-Ya Wang, Taipei (TW); Chung-Hu Ke, Taipei (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/722,247

(22) Filed: Mar. 11, 2010

(65) Prior Publication Data

US 2010/0167485 A1 Jul. 1, 2010

Related U.S. Application Data

(62) Division of application No. 11/807,127, filed on May 25, 2007, now Pat. No. 7,709,903.

(51) Int. Cl.
*H01L 21/3205* (2006.01)

(52) U.S. Cl. ........ 438/649; 438/299; 438/655; 438/630; 438/721; 438/755; 257/E21.593; 257/E21.619

(58) Field of Classification Search .................. 257/382, 257/E21.593, E21.619; 438/299, 655, 649, 438/630, 721, 755
See application file for complete search history.

(56) References Cited

U.S. PATENT DOCUMENTS

| | | | |
|---|---|---|---|
| 4,966,865 A * | 10/1990 | Welch et al. ................. | 438/624 |
| 5,049,975 A | 9/1991 | Ajika et al. | |
| 6,004,878 A * | 12/1999 | Thomas et al. ............... | 438/655 |
| 6,541,863 B1 | 4/2003 | Horstmann et al. | |
| 2002/0117707 A1 | 8/2002 | Dennison | |
| 2004/0256645 A1 | 12/2004 | Tsuchiaki et al. | |
| 2005/0045969 A1* | 3/2005 | Lee et al. ...................... | 257/410 |
| 2005/0250319 A1* | 11/2005 | Carruthers et al. ........... | 438/655 |
| 2005/0258499 A1* | 11/2005 | Huang et al. .................. | 257/382 |

OTHER PUBLICATIONS

Zhang et al., "Barrier-free direct-contact-via (DCV) structures for copper interconnects" Electronics Letters 29th Aug. 2002 vol. 38 No. 18 p. 1026.*

Li, C.Y, et al., "Barrier-free direct-contact-via (DCV) structures for copper interconnects," Electronics Letters, Aug. 29, 2002, pp. 1026-1028, vol. 38, No. 18.

Arnal, V., et al., "45 nm Node Multi Level Interconnects with Porous SiOCH Dielectric k=2.5," 2006 International Interconnect Technology Conference, Jun. 7, 2006, IEEE, pp. 213-215.

Demuynck, S., et al., "Impact of Cu contacts on front-end performance: a projection towards 22nm node," 2006 International Interconnect Technology Conference, Jun. 7, 2006, IEEE, pp. 178-180.

(Continued)

*Primary Examiner* — Ngan Ngo
*Assistant Examiner* — Benjamin Tzu-Hung Liu
(74) *Attorney, Agent, or Firm* — Slater & Matsil, L.L.P.

(57) ABSTRACT

A semiconductor structure includes a semiconductor substrate; a gate dielectric over the semiconductor substrate; a gate electrode over the gate dielectric; a source/drain region adjacent the gate dielectric; a silicide region on the source/drain region; a metal layer on top of, and physical contacting, the silicide region; an inter-layer dielectric (ILD) over the metal layer; and a contact opening in the ILD. The metal layer is exposed through the contact opening. The metal layer further extends under the ILD. The semiconductor structure further includes a contact in the contact opening.

14 Claims, 6 Drawing Sheets

OTHER PUBLICATIONS

Itabashi, T., et al., "Electroless Deposited CoWB for Copper Diffusion Barrier Metal," Proceedings of the IEEE 2002 International Interconnect Technology Conference, 2002, IEEE, pp. 285-287.

Topol, A., et al, "Lower Resistance Scaled Metal Contacts to Silicide for Advanced CMOS," 2006 Symposium on VLSI Technology Digest of Technical Papers, IEEE, 2 pp.

* cited by examiner

CONTACT BARRIER STRUCTURE AND MANUFACTURING METHODS

This application is a divisional of U.S. patent application Ser. No. 11/807,12, filed May 25, 2007, and entitled "Contact Barrier Structure and Manufacturing Methods," which application is hereby incorporated herein by reference.

TECHNICAL FIELD

This invention relates generally to integrated circuits, and more particularly to the formation of contact plugs for connecting semiconductor devices and metallization layers.

BACKGROUND

In modern integrated circuits, semiconductor devices are formed on semiconductor substrates, and are connected through metallization layers. The metallization layers are connected to the semiconductor devices through contacts, also referred to as contact plugs. Also, external pads are connected to the semiconductor devices through the contacts.

FIG. 1 illustrates conventional contacts for connecting the semiconductor devices to the metallization layers. Metal-oxide-semiconductor (MOS) device 4 is formed at the surface of semiconductor substrate 2. Inter-layer dielectric (ILD) 10 is formed over MOS device 4. Contacts 6 are formed in ILD 10 to connect source and drain regions 14 and gate 16 of MOS device 4 to metal lines 7, which are in metallization layer 8. Typically, the formation of contacts 6 includes forming openings in ILD 10, and then filling the openings with tungsten plugs. A single damascene process is then performed to form metallization layer 8.

Due to tungsten's relatively low conductivity, copper is increasingly used to replace tungsten for forming contacts. Copper has a significantly higher conductivity (about 0.596 $10^6$/cm·Ω) than tungsten (about 0.189 $10^6$/cm·Ω). Therefore, the resulting resistances of copper contacts are significantly lower than that of tungsten contacts. However, copper has greater diffusion distance. Under elevated temperatures, copper tends to diffuse into the underlying source/drain regions 14 and gate electrode 16, forming copper silicide therein. This adversely increases the leakage currents, and may even cause device failure. To solve this problem, diffusion barriers 12 were formed on the bottoms and sidewalls of the contact openings before filling copper. The bottom portions of diffusion barriers 12 prevent copper from diffusing into the underlying source/drain regions 14 and gate electrode 16.

With the increasing down-scaling of integrated circuits, the above-discussed processes experience shortcomings. While the horizontal dimensions, such as the width W of contacts 6, are continuously shrinking, the thickness of ILD 10 is not reduced accordingly to the same scale as width W of contact plugs 6. Accordingly, the aspect ratio of contacts 6 continuously increases. The high aspect ratio results in difficulties in the formation of contact barriers 12, which in turn causes bottom portions of the contact barriers to be discontinuous. Copper thus adversely diffuses into the underlying source/drain regions and gate electrode.

Accordingly, what is needed in the art is a new contact barrier structure and formation methods for solving the above-discussed problems.

SUMMARY OF THE INVENTION

In accordance with one aspect of the present invention, a semiconductor structure includes a semiconductor substrate; a gate dielectric over the semiconductor substrate; a gate electrode over the gate dielectric; a source/drain region adjacent the gate dielectric; a silicide region on the source/drain region; a metal layer on top of, and physical contacting, the silicide region; an inter-layer dielectric (ILD) over the metal layer; and a contact opening in the ILD. The metal layer is exposed through the contact opening. The metal layer further extends under the ILD. The semiconductor structure further includes a contact in the contact opening.

In accordance with another aspect of the present invention, a semiconductor structure includes a semiconductor substrate; a gate dielectric over the semiconductor substrate; a gate electrode over the gate dielectric; a source/drain region adjacent the gate dielectric; a silicide region on the source/drain region; a metal layer on top of, and physical contacting, the silicide region; an inter-layer dielectric (ILD) over the metal layer; a contact opening in the ILD, wherein the metal layer is exposed through the contact opening; a contact in the contact opening; and a contact barrier layer encircling the contact and separating the contact from the ILD, wherein the contact barrier layer and the metal layer comprise different materials.

In accordance with yet another aspect of the present invention, a semiconductor structure includes a semiconductor substrate; a gate dielectric over the semiconductor substrate; a gate electrode over the gate dielectric; a source/drain region adjacent the gate dielectric; a silicide region on the source/drain region; a metal layer over and in physical contact the silicide region, wherein the metal layer comprises a same metal as the silicide region; an inter-layer dielectric (ILD) over the silicide region and the gate electrode; an opening having sidewalls and a bottom in the ILD; a contact comprising copper in the opening; a diffusion barrier layer separating the contact and the ILD. The diffusion barrier layer extends onto only a portion of the bottom of the opening. The contact physically contacts the metal layer through an opening in the diffusion barrier layer.

In accordance with yet another aspect of the present invention, a method of forming a semiconductor structure includes providing a semiconductor substrate; forming a silicon-containing component electrically connected to the semiconductor substrate; forming a metal layer on the silicon-containing component; reacting the metal layer with the silicon-containing component to form a silicide region, wherein a top portion of the metal layer is not consumed by the step of reacting; forming a contact over and electrically connected to the top portion of the metal layer; and forming a contact barrier layer at least encircling the contact.

In accordance with yet another aspect of the present invention, a method of forming a semiconductor structure includes providing a semiconductor substrate; forming a gate dielectric over the semiconductor substrate; forming a gate electrode over the gate dielectric; forming a source/drain region adjacent the gate dielectric; forming a metal layer covering at least the source/drain region; reacting only a bottom portion of the metal layer with the source/drain region to form a silicide region, wherein a top portion of the metal layer remains after the step of reacting; forming an ILD over the silicide region and the gate electrode; forming a contact in the ILD, wherein the contact is fully situated over, and electrically connected to, the top portion of the metal layer.

The advantageous features of the present invention include reduced copper diffusion into source/drain regions and the gate electrode of metal-oxide-semiconductor (MOS) devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel contact structure is provided. The intermediate stages of manufacturing an embodiment of the present invention are illustrated. The variations of the embodiment are then discussed. Throughout the various views and illustrative embodiments of the present invention, like reference numbers are used to designate like elements.

Figure 1:
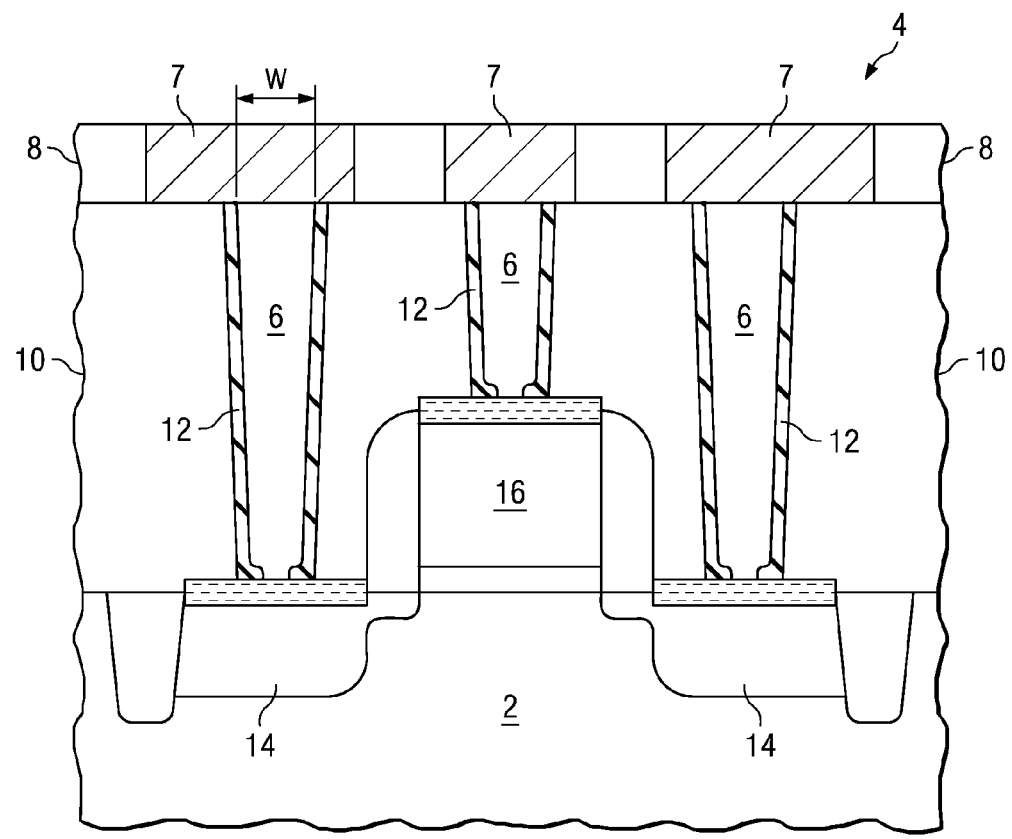
FIG. 1 illustrates a conventional contact structure.
Figure 2:
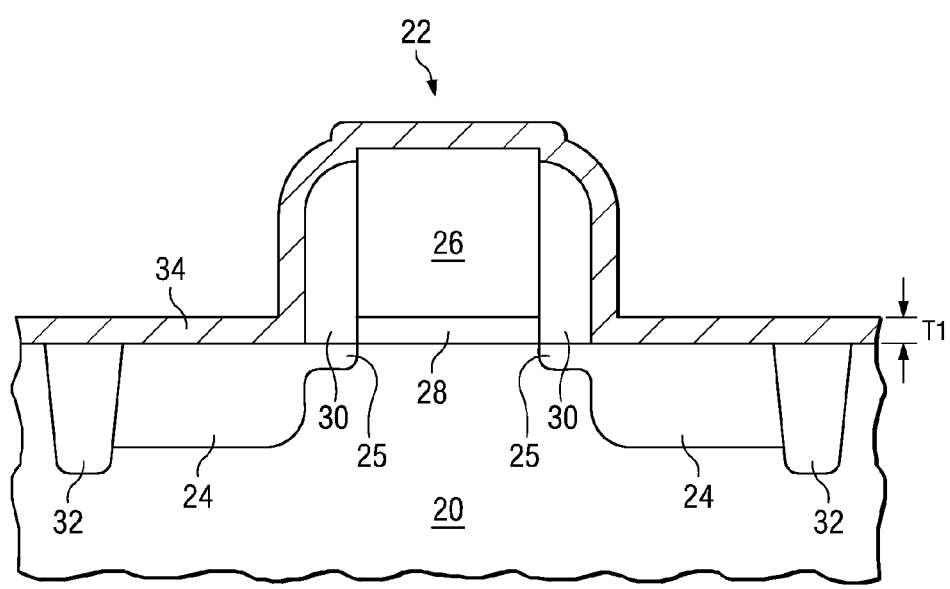
FIGS. 2 through 6 are cross-sectional views of intermediate stages in the manufacturing of a first embodiment of the present invention, wherein a metal layer for forming metal silicide regions is blanket formed.

FIGS. 2 though 6 illustrate cross-sectional views of a first embodiment of the present invention. Referring to FIG. 2, substrate 20 is provided. Substrate 20 is preferably a semiconductor substrate, which may include semiconductor materials such as silicon or silicon compounds.

Metal-oxide-semiconductor (MOS) device 22 is formed at the surface of substrate 20. MOS device 22 includes source and drain regions 24 (referred to as source/drain regions hereinafter), gate electrode 26, gate dielectric 28 and gate spacers 30. Lightly doped source/drain (LDD) regions 25 may also be formed. Shallow trench isolation regions 32 may be formed to isolate MOS device 22 from other integrated circuit devices.

As is known in the art, gate electrode 26 may be formed of polysilicon or other conductive materials, such as metals, metal silicides, metal nitrides, and the like. Source/drain regions 24 and LDD regions 25 may be formed by implanting desired n-type or p-type impurities, and may be either recessed or elevated. To increase drive currents, silicon germanium (SiGe) stressors (not shown) may be formed for p-type MOS (PMOS) devices, while carbon-doped source/drain regions may be formed for n-type MOS (NMOS) devices. Accordingly, source/drain regions 24 may include silicon, silicon germanium, or carbon-doped silicon.

Metal layer 34 is blanket deposited over MOS device 22. Metal layer 34 may include commonly used metals for forming metal silicides, such as nickel, cobalt, tantalum, ruthenium, tungsten, platinum, manganese, palladium, erbium, hafnium, zirconium, and combinations thereof. Thickness T1 of metal layer 34 is preferably greater than what is required for the subsequent silicidation process. In an exemplary embodiment, thickness T1 is greater than about 100 Å. One skilled in the art will realize, however, that the dimensions recited throughout the description are merely examples, and will be scaled accordingly with the scaling of the formation technologies. In the preferred embodiment, physical vapor deposition (PVD) is used for forming metal layer 34, although other commonly used methods, such as sputtering, low pressure CVD (LPCVD), and the like, can also be used.

Figure 3:
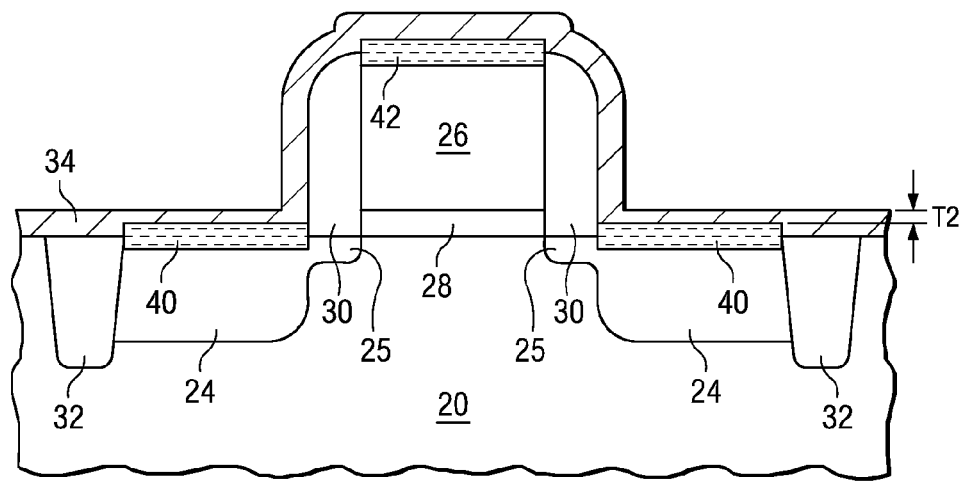

Referring to FIG. 3, an annealing is performed, forming silicide where metal layer 34 contacts silicon or silicon germanium. As a result, source/drain silicide regions 40, and possibly gate silicide region 42 (if gate electrode 26 comprises silicon), are formed. If source/drain regions 24 include silicon germanium, germano-silicide regions 40 will be formed. Throughout the description, germano-silicide regions are also referred to as silicide regions. The annealing may be performed at a temperature of about 400° C. or higher, although a lower temperature is always desirable, providing the quality of the resulting silicide regions is not compromised. As is known in the art, the annealing process may be performed using thermal annealing, flash annealing, laser annealing, and the like. In an exemplary embodiment, the annealing process comprises two steps. The first step includes a first annealing at a relatively low temperature, causing a portion of metal layer 34 to react with underlying silicon to form a silicide. This silicide typically has a higher resistivity than in the final structure. The second step includes a second annealing to convert the high-resistivity silicide to a low-resistivity silicide. In an exemplary embodiment, the first annealing is performed at about 400° C., while the second annealing is performed at about 700° C.

After the annealing process, the portions of metal layer 34 on source/drain regions 24 and gate electrode 26 are only partially consumed, and top portions of metal layer 34 still remain on source/drain regions 24 and gate electrode 26. In an exemplary embodiment, the thickness T2 of the remaining metal layer 34 over source/drain regions 24 and gate electrode 26 is greater than about 50 Å, and more preferably between about 50 Å and about 100 Å. One skilled in the art will realize that thickness T2 of the remaining metal layer 34 is related to the metals in metal layer 34, the annealing temperature, and the anneal duration, and will be able to find optimum process conditions through experiments.

Figure 4A:
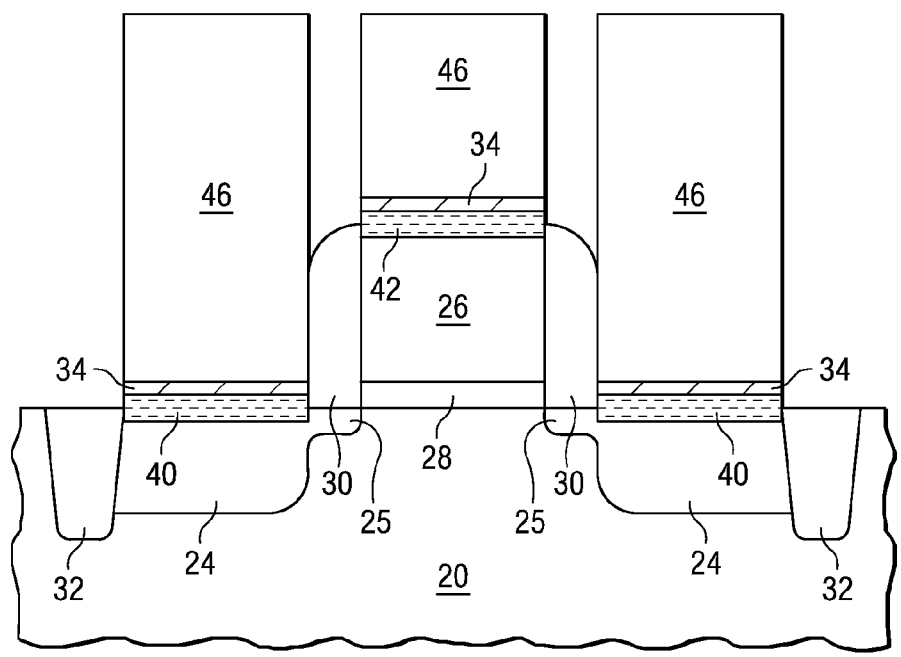
Figure 4B:
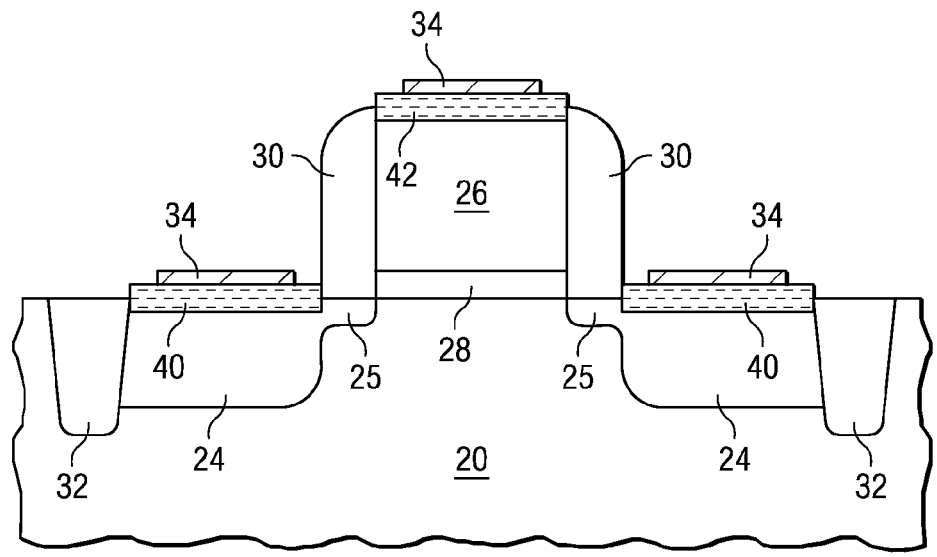

Next, as is shown in FIG. 4A, a selective etching is performed. Preferably, photo resist 46 (or other mask layer such as silicon nitride mask) is applied and patterned, covering source/drain regions 24 and gate electrode 26. An etching is then performed to remove exposed metal layer 34. Photo resist 46 is then removed. Preferably, in the resulting structure, only portions of metal layer 34 over metal silicides are left, while the remaining metal layer 34 are removed. In a first embodiment, as is shown in FIG. 4A, the remaining portions of metal layer 34 substantially overlap the underlying silicide regions 40 and 42. In other embodiments, as is shown in FIG. 4B, the remaining portions of metal layer 34 are substantially smaller than the underlying silicide regions 40, but are great enough so that the subsequently formed contacts completely land on the remaining portions of metal layer 34. In yet other embodiments, the remaining portions of metal layer 34 may even be slightly greater than the respective underlying silicide regions 40 and 42, and may extend substantially over STI regions 32.

Figure 5:
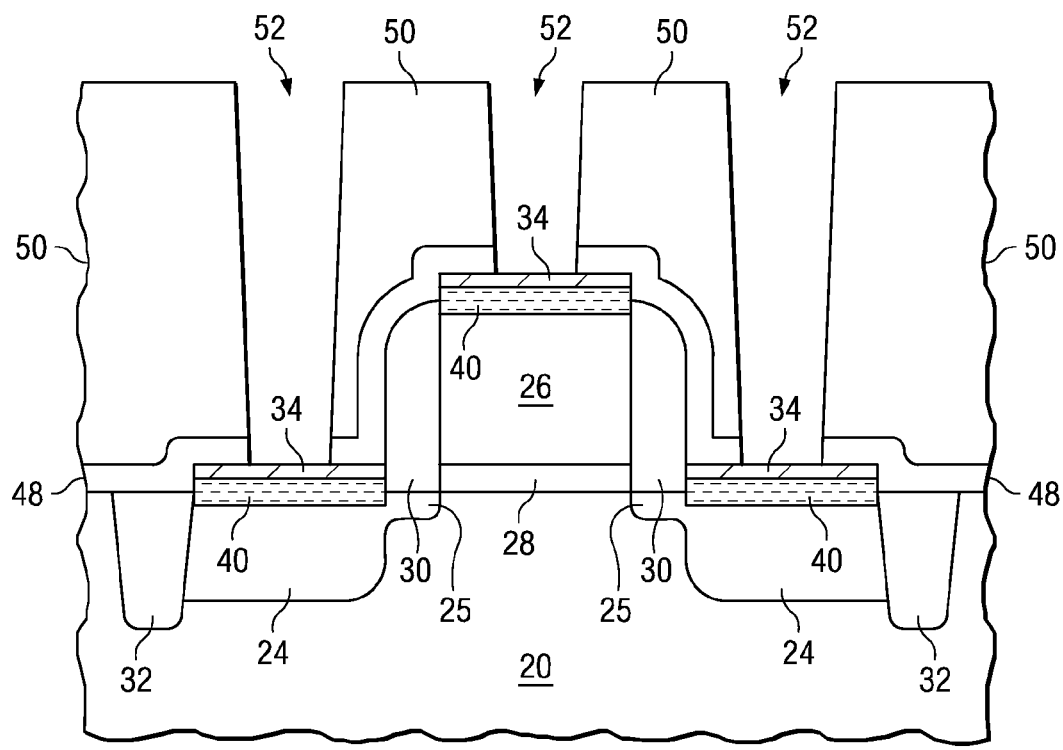

Referring to FIG. 5, etch stop layer (ESL) 48 is formed over MOS device 22. In an embodiment, ESL 48 includes silicon nitride. In other embodiments, ESL 48 includes other commonly used dielectric materials, such as silicon oxynitride, silicon oxycarbide, silicon carbide, and the like. Preferably, ESL 48 provides a desirable stress to the channel region of MOS device 22.

Inter-layer dielectric (ILD) 50 is formed over ESL 48. Exemplary materials of ILD 50 include boronphosphosilicate glass (BPSG), phosphosilicate glass (PSG), un-doped silicon oxide, and other commonly used ILD materials. As a result, ILD 50 may be porous or non-porous, depending on its materials and formation processes.

FIG. 5 also shows an etching to remove portions of ILD 50, forming contact openings 52. Exposed portions of ESL 48 are then removed through contact openings 52, exposing underlying metal layer 34.

Figure 6:
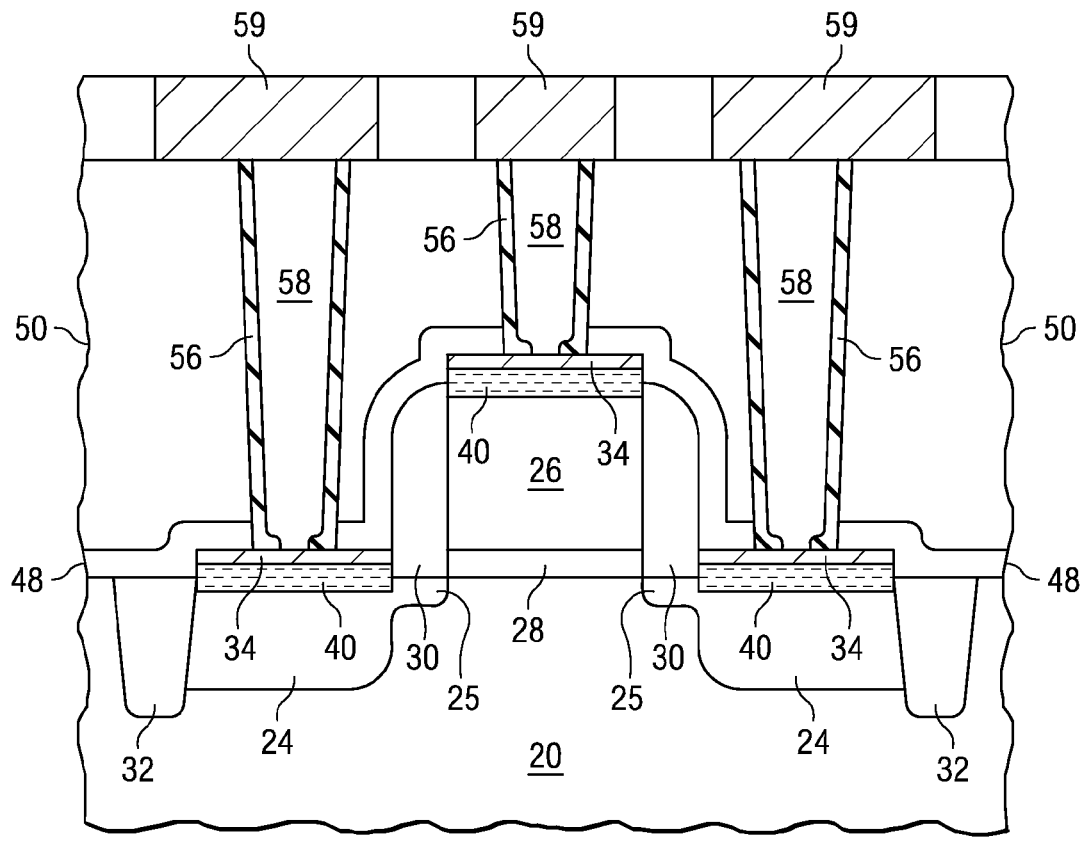

In FIG. 6, contacts 58, often equally referred to as contact plugs 58, are formed by filling conductive materials into contact openings 52. Optionally, before forming contacts 58, contact barriers 56 are formed on the sidewalls of contact openings 52. Contact barriers 56 may include commonly used barrier materials, such as titanium, titanium nitride, tantalum, tantalum nitride, and the like. The preferred thickness is less than about 50 Å. Preferably, contact barriers 56 are formed if ILD 50 is porous, and hence the diffusion of contact materials into the pores will adversely affect the performance and reliability of the resulting integrated circuit. If, however, ILD 50 is formed of relatively dense materials, and hence the diffusion of the materials in contacts 58 is not an issue, contact barriers 56 may be omitted.

In the preferred embodiment, contacts 58 comprise copper or copper alloys. Advantageously, the resistances of contacts 58 are reduced. Alternatively, other conductive materials such as aluminum, tungsten, and the like, may also be used. After the filling of contact materials into contact openings 52, a chemical mechanical polish may be performed to remove excess materials, leaving contacts 58 and contact barriers 56.

With the increasing down-scaling of integrated circuits, the aspect ratio of contact openings 52 becomes increasingly greater. As a result, in the future generation of integrated circuits, the increased aspect ratio may cause the bottom coverage of contact barriers 56 to be poor, and then contact barriers 56 either do not completely cover the bottoms of contact openings 52, or the bottom portions of contact barriers 56 are too thin to prevent the diffusion. Therefore, if the remaining metal layer 34 does not exist, the copper in contacts 58 may diffuse into the underlying source/drain silicides 40 and/or 42, causing an increase in leakage currents, and even the failure of MOS device 22. The remaining portions of metal layer 34 thus act as contact barriers, preventing the undesirable diffusion of contact materials. Accordingly, the thickness T2 (refer to FIG. 3) of the remaining metal layer 34 needs to be great enough so that it may effectively prevent diffusion.

In subsequent processes, the bottom metallization layer (commonly referred to as M1) is formed, and metal lines 59 in M1 are connected to contacts 58.

Figure 7:
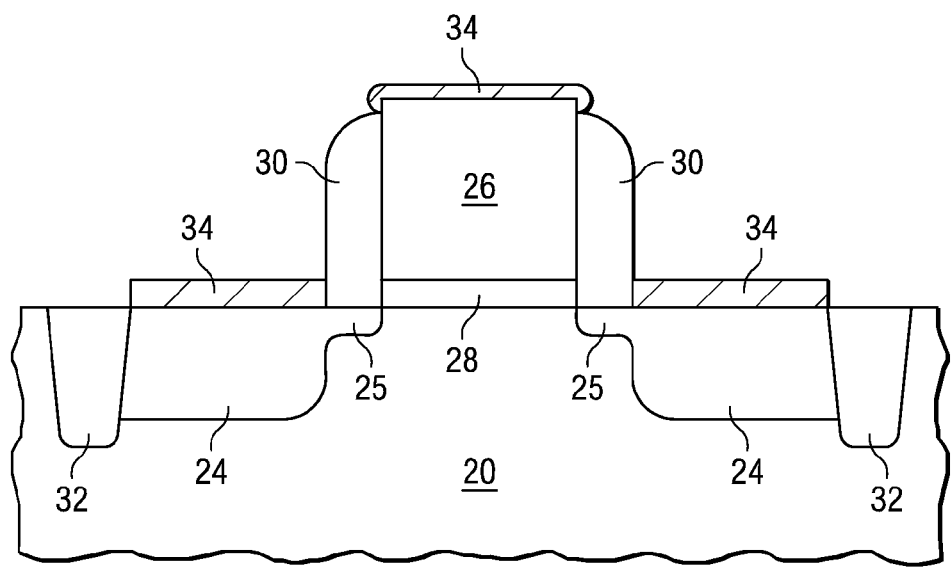
FIGS. 7 and 8 are cross-sectional views of intermediate stages in the manufacturing of a second embodiment of the present invention, wherein a metal layer for forming metal silicide regions is selectively formed.
Figure 8:
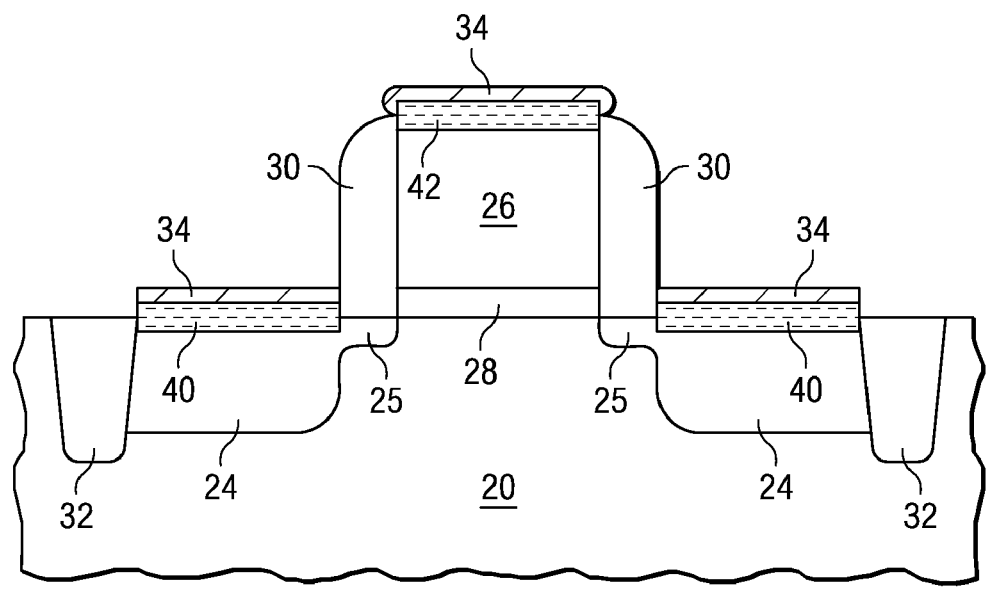

FIGS. 7 and 8 illustrate a variation of the embodiment discussed in the preceding paragraphs. After the formation of MOS device 22, metal layer 34 are selectively formed on silicon surfaces, such as the surfaces of source/drain regions 24 and/or gate electrode 26, but not on the surfaces of dielectric materials, such as gate spacers 30 and STI regions 32. In an embodiment, the selective formation is achieved using atomic layer deposition (ALD). In alternative embodiments, electroless plating may be performed by submerging the respective wafer into a plating solution.

In FIG. 8, a silicidation process is performed. The silicidation process is essentially the same as discussed in the preceding paragraphs, and thus is not repeated herein. In the resulting structure, the remaining portions of metal layer 34 fully overlap the underlying silicide regions 40 and 42.

Figure 9:
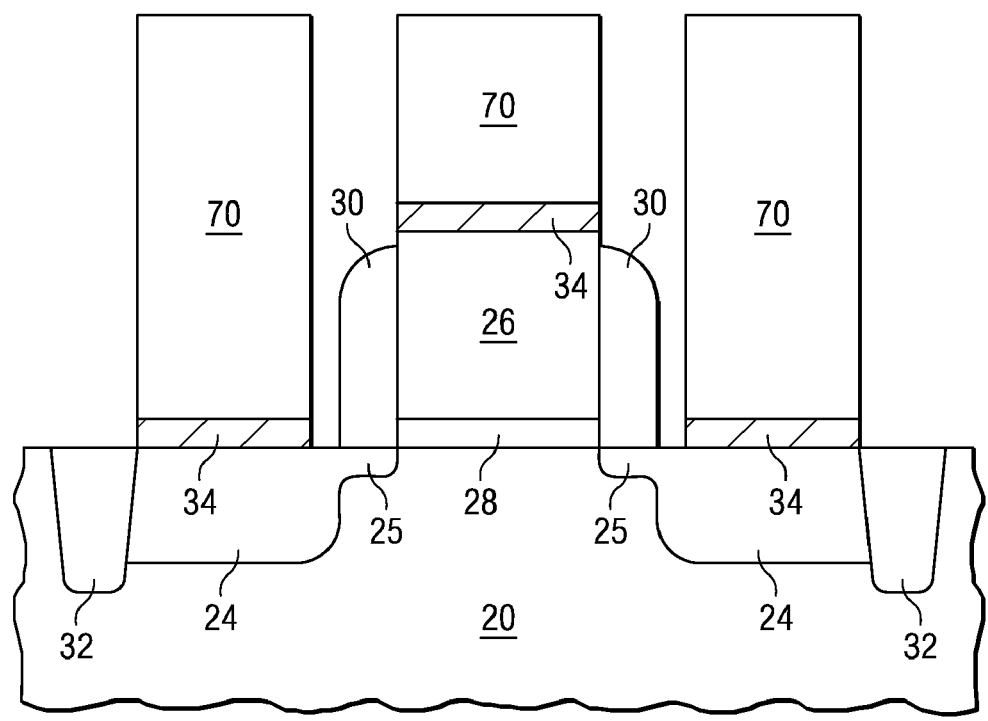
FIGS. 9 through 10B are cross-sectional views of intermediate stages in the manufacturing of a third embodiment of the present invention, wherein a metal layer is blanket formed and selectively etched before a silicide process is performed.
Figure 10A:
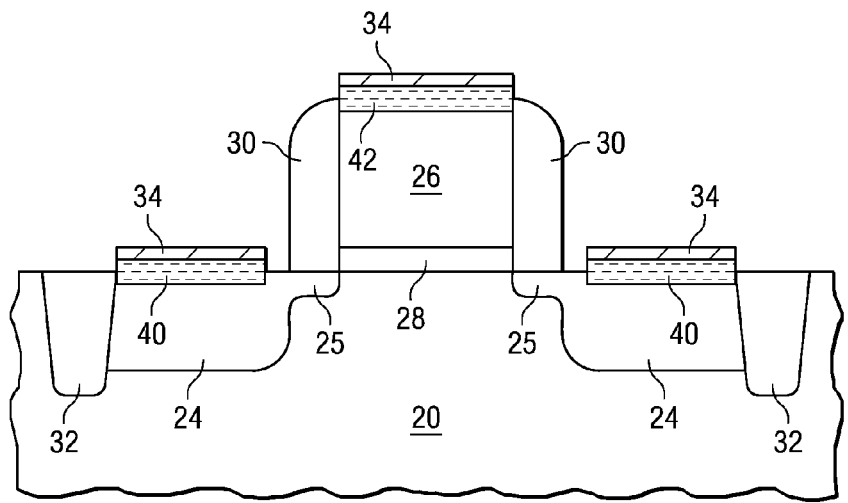
Figure 10B:
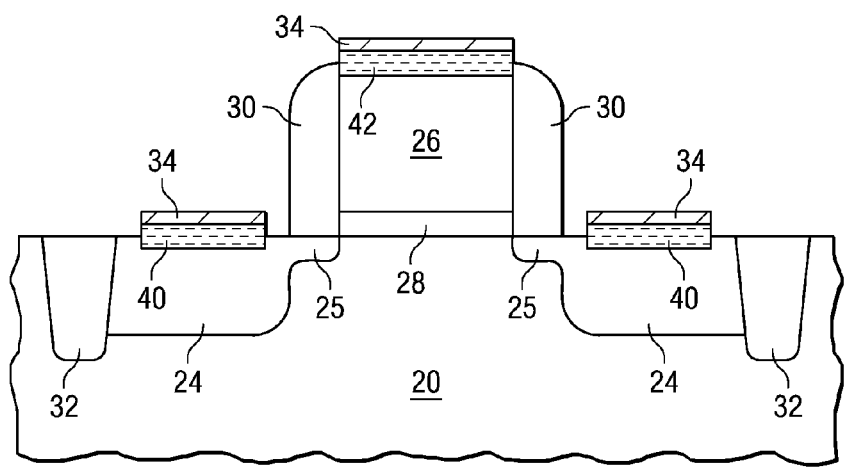

FIGS. 9 through 10B illustrate a further variation of the present invention. In this embodiment, after metal layer 34 is blanket formed, as is shown in FIG. 2, photo resist 70 is formed and patterned, masking source/drain regions 24 and gate electrode 26, as is shown in FIG. 9. Exposed portions of metal layer 34 are then removed, followed by the removal of photo resist 70. The silicidation process is then performed, forming a structure substantially similar to the structure as shown in FIG. 10A. In an embodiment, the remaining portions of metal layer 34 are substantially co-terminus with the respective source/drain regions 24 and gate electrode 26, as is shown in FIG. 4A (except there is no photo resist 46). Alternatively, the remaining portions of metal layer 34 are smaller than source/drain regions 24 and/or gate electrode 26, resulting in structures shown in FIGS. 10A and 10B. In yet other embodiments, the remaining portions of metal layer 34 may extend over STI regions 32, as illustrated by the dotted lines in FIG. 10A.

Figure 11:
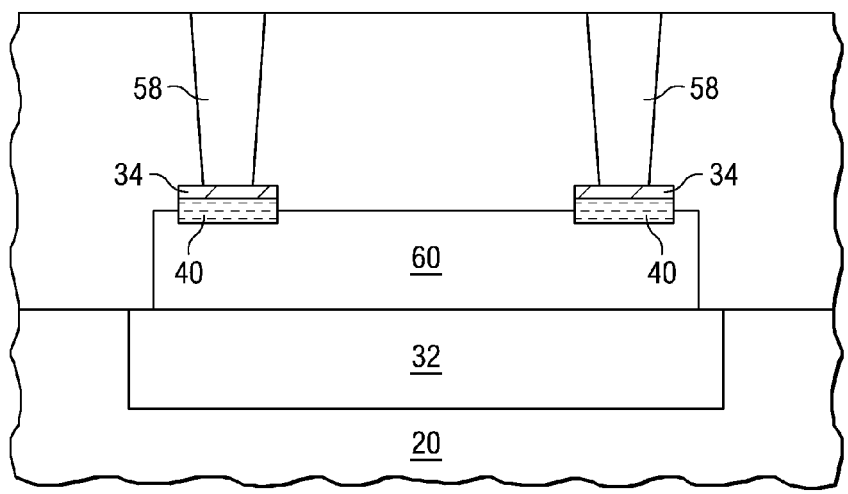
FIG. 11 illustrates a resistor, wherein contacts to the resistor are each made through a metal layer and a silicide region.

It is appreciated that the teaching provided by the embodiments of the present invention may be applied to the formation of other semiconductor devices. For example, FIG. 11 illustrates the formation of a resistor, which includes polysilicon strip 60 over STI region 32. Contacts 58 are electrically connected to polysilicon strip 60 through silicide regions 40 and overlying metal layers 34, wherein metal layers 34 and silicide regions 40 are formed using essentially the same materials and formation processes as discussed in the preceding paragraphs. Furthermore, polysilicon strip 60, silicide regions 40, and metal layers 34 may be formed simultaneously with the formation of gate electrode 26, and corresponding silicide regions 40 and metal layer 34 for MOS device 22, respectively.

The embodiments of the present invention have several advantageous features. By keeping un-reacted metal layer on the silicide regions, the diffusion from contacts into the underlying regions are reduced, and possibly substantially eliminated. This allows the formation of copper contacts possible, in turn improving the conductivity of contacts and device performances such as drive currents. The embodiments of the present invention are particularly useful in future-generation integrated circuits, whose contacts are expected to have even greater aspect ratios. An additional advantageous feature of the present invention is that substantially no extra cost is involved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   forming a silicon-containing component;
   forming a metal layer on the silicon-containing component;
   reacting the metal layer with the silicon-containing component to form a silicide region, wherein a top portion of the metal layer is not consumed by the step of reacting;
   selectively removing a first portion of the top portion of the metal layer, wherein a second portion of the top portion of the metal layer remains after the selective removal;
   forming a contact over and electrically connected to the second portion of the top portion of the metal layer; and
   forming a contact barrier layer at least encircling the contact.

2. The method of claim 1, wherein the first portion of the top portion of the metal layer is vertically aligned to a first portion of the silicon-containing component, and wherein the second portion of the top portion of the metal layer is vertically aligned to a second portion of the silicon-containing component.

3. The method of claim 1, wherein the step of forming the metal layer comprises selectively depositing the metal layer.

4. The method of claim 3, wherein the selective depositing comprises depositing using atomic layer deposition.

5. The method of claim 3, wherein the selective depositing comprises electroless plating.

6. The method of claim 1 further comprising:
   forming an inter-layer dielectric (ILD) over the silicon-containing component;
   forming an opening in the ILD; and
   before the step of forming the contact in the opening, forming the contact barrier layer in the opening.

7. The method of claim 6, wherein the contact barrier layer partially covers a bottom of the opening.

8. The method of claim 6, wherein the contact comprises copper.

9. A method of forming a semiconductor structure, the method comprising:
   providing a semiconductor substrate;
   forming a gate dielectric over the semiconductor substrate;
   forming a gate electrode over the gate dielectric;
   forming a source/drain region adjacent the gate dielectric;
   forming a metal layer covering at least the source/drain region;
   selectively removing a first portion of the metal layer directly over the source/drain region, wherein a second portion of the metal layer directly over the source/drain region is not removed;
   after the step of selectively removing the first portion of the metal layer, reacting a bottom portion of the metal layer with the source/drain region to form a silicide region, wherein a top portion of the metal layer remains after the step of reacting;
   forming an inter-layer dielectric (ILD) over the silicide region and the gate electrode;
   forming a contact in the ILD, wherein the contact is fully situated over, and electrically and directly connected to, the top portion of the metal layer.

10. The method of claim 9, wherein the step of forming the metal layer comprises selective deposition.

11. The method of claim 10, wherein the selective deposition comprises atomic layer deposition.

12. The method of claim 10, wherein the selective deposition comprises electroless plating.

13. The method of claim 9, wherein the step of forming the contact further comprises forming an opening in the ILD, and wherein the method further comprises forming a contact barrier layer in the opening before the step of forming the contact.

14. The method of claim 13, wherein the contact barrier layer only partially covers a bottom of the opening.

* * * * *